(12) United States Patent
Yang

(10) Patent No.: US 7,381,999 B1
(45) Date of Patent: Jun. 3, 2008

(54) WORKFUNCTION-ADJUSTED THYRISTOR-BASED MEMORY DEVICE

(75) Inventor: Kevin J. Yang, Santa Clara, CA (US)

(73) Assignee: T-Ram Semiconductor, Inc., Milpitas, CA (US)

( * ) Notice: Subject to any disclaimer, the term of this patent is extended or adjusted under 35 U.S.C. 154(b) by 354 days.

(21) Appl. No.: 11/187,777

(22) Filed: Jul. 21, 2005

(51) Int. Cl.
*H01L 29/74* (2006.01)
(52) U.S. Cl. .................. 257/133; 257/392; 257/407
(58) Field of Classification Search ............... 257/133, 257/146, 153, 392, 407, 412; 365/182
See application file for complete search history.

(56) References Cited

U.S. PATENT DOCUMENTS

| | | | |
|---|---|---|---|
| 6,462,359 B1 | 10/2002 | Nemati et al. | |
| 6,583,452 B1 | 6/2003 | Cho et al. | |
| 6,611,452 B1 | 8/2003 | Han | |
| 6,653,174 B1 | 11/2003 | Cho et al. | |
| 6,653,175 B1 | 11/2003 | Nemati et al. | |
| 6,666,481 B1 | 12/2003 | Horch et al. | |
| 6,683,330 B1 | 1/2004 | Horch et al. | |
| 6,686,612 B1 | 2/2004 | Horch et al. | |
| 6,690,038 B1 | 2/2004 | Cho et al. | |
| 6,690,039 B1 | 2/2004 | Nemati et al. | |
| 6,703,646 B1 | 3/2004 | Nemati et al. | |
| 6,721,220 B2 | 4/2004 | Yoon et al. | |
| 6,727,528 B1 | 4/2004 | Robins et al. | |
| 6,734,815 B1 | 5/2004 | Abdollahi-Alibeik et al. | |
| 6,735,113 B2 | 5/2004 | Yoon et al. | |
| 6,756,612 B1 | 6/2004 | Nemati et al. | |
| 6,756,838 B1 | 6/2004 | Wu et al. | |
| 6,767,770 B1 | 7/2004 | Horch et al. | |
| 6,777,271 B1 | 8/2004 | Robins et al. | |
| 6,778,435 B1 | 8/2004 | Han et al. | |
| 6,781,888 B1 | 8/2004 | Horch et al. | |
| 6,785,169 B1 | 8/2004 | Nemati et al. | |
| 6,790,713 B1 | 9/2004 | Horch | |
| 6,804,162 B1 | 10/2004 | Eldridge et al. | |
| 6,815,734 B1 | 11/2004 | Horch et al. | |
| 6,818,482 B1 | 11/2004 | Horch et al. | |
| 6,819,278 B1 | 11/2004 | Abdollahi-Alibeik et al. | |
| 6,828,176 B1 | 12/2004 | Nemati et al. | |

(Continued)

OTHER PUBLICATIONS

Kedzierski, J. et al., Metal-gate FinFET and fully-depleted SOI devices using total gate silicidation. IEDM Technical Digest, 2002, IEEE.

(Continued)

*Primary Examiner*—Mark V. Prenty
(74) *Attorney, Agent, or Firm*—The Webostad Firm

(57) ABSTRACT

A memory device having a thyristor-based storage element and an access device coupled to the thyristor-based storage element at a common storage node is described. The thyristor-based storage element has a first gate stack, where the first gate stack has a first workfunction configured to a base region of the thyristor-based storage element. The access device has a second gate stack, where the second gate stack has a second workfunction. The first gate stack includes a first conductive layer formed over a gate dielectric and a second conductive layer formed over the first conductive layer. The second gate stack includes the second conductive layer formed over the gate dielectric. The first workfunction is operationally distinct from the second workfunction.

25 Claims, 9 Drawing Sheets

U.S. PATENT DOCUMENTS

| | | |
|---|---|---|
| 6,828,202 B1 | 12/2004 | Horch |
| 6,835,997 B1 | 12/2004 | Horch et al. |
| 6,845,037 B1 | 1/2005 | Han |
| 6,872,602 B1 | 3/2005 | Nemati et al. |
| 6,885,581 B2 | 4/2005 | Nemati et al. |
| 6,888,176 B1 | 5/2005 | Horch et al. |
| 6,888,177 B1 | 5/2005 | Nemati et al. |
| 6,891,205 B1 | 5/2005 | Cho et al. |
| 6,891,774 B1 | 5/2005 | Abdollahi-Alibeik et al. |
| 6,901,021 B1 | 5/2005 | Horch et al. |
| 6,903,987 B2 | 6/2005 | Yoon et al. |
| 6,911,680 B1 | 6/2005 | Horch et al. |
| 6,913,955 B1 | 7/2005 | Horch et al. |
| 6,937,085 B1 | 8/2005 | Samaddar |
| 6,940,772 B1 | 9/2005 | Horch et al. |
| 6,944,051 B1 | 9/2005 | Lee et al. |
| 6,947,349 B1 | 9/2005 | Abdollahi-Alibeik et al. |
| 6,953,953 B1 | 10/2005 | Horch |
| 6,958,931 B1 | 10/2005 | Yoon et al. |
| 6,965,129 B1 | 11/2005 | Horch et al. |
| 7,195,959 B1 * | 3/2007 | Plummer et al. ........... 438/133 |

OTHER PUBLICATIONS

Kedzierski, J. et al., Threshold voltage control in NiSi-gated MOSFETs through silicidation induced impurity seregation (SIIS), IEDM Technical Digest, 2003, IEEE.

Lu, Q. et al., Metal gate work function adjustment for future CMOS technology. Symposium on VLSI Technology Digest of Technical Papers, 2001, IEEE.

Narayanan, V. et al., Dual work function metal gate CMOS using CVD metal electrodes. Symposium on VLSI Technology Digest of Technical Papers, 2004, IEEE.

Polishchuk, I. et al., Dual work function metal gate CMOS technology using metal interdiffusion. IEEE Electron Device Letters, vol. 22, No. 9, 2001, pp. 444-446, IEEE.

Ponomarev, Y. et al., Gate-workfunction engineering using poly-(Si,Ge) for high-performance 0.18um CMOS technology. IEDM Technical Digest, 1997, IEEE.

Samavedam, L. et al., Dual-metal gate CMOS with HfO2 Gate Dielectric. IEDM Technical Digest, 2002, IEEE.

Tavel, B. et al., Totally silicided (CoSi2) polysilicon: a novel approach to very low-resistive gate without metal CMP nor etching. IEDM Technical Digest, 2001, IEEE.

Yeo, Y. et al., Dual-metal gate CMOS technology with ultrathin silicon nitride gate dielectric. IEEE Electron Device Letters, vol. 22, No. 5., 2001, pp. 227-229, IEEE.

* cited by examiner

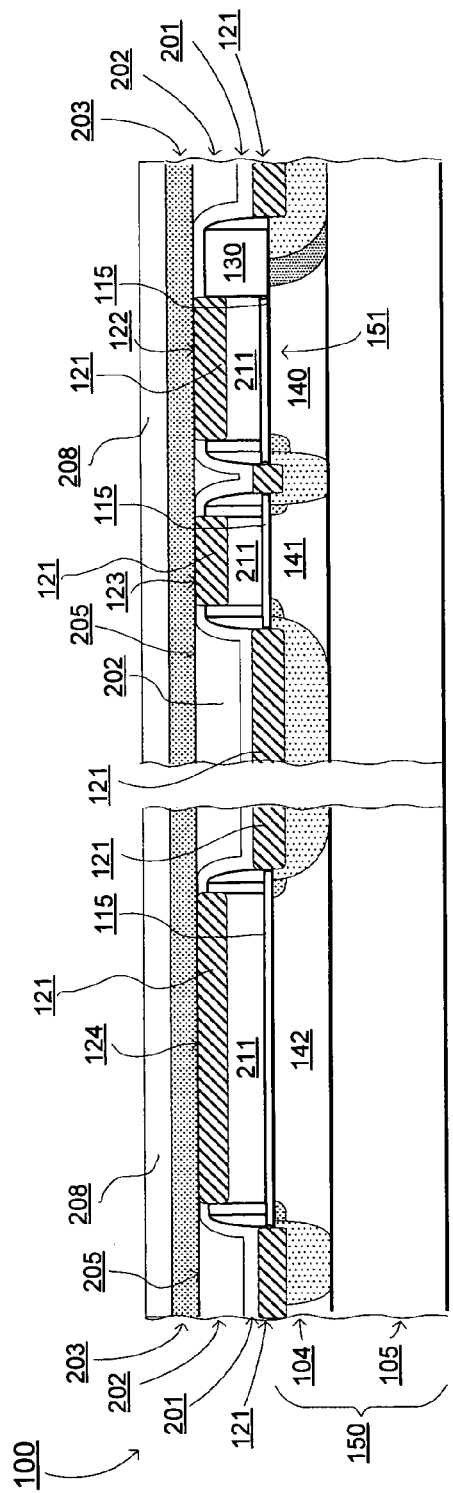
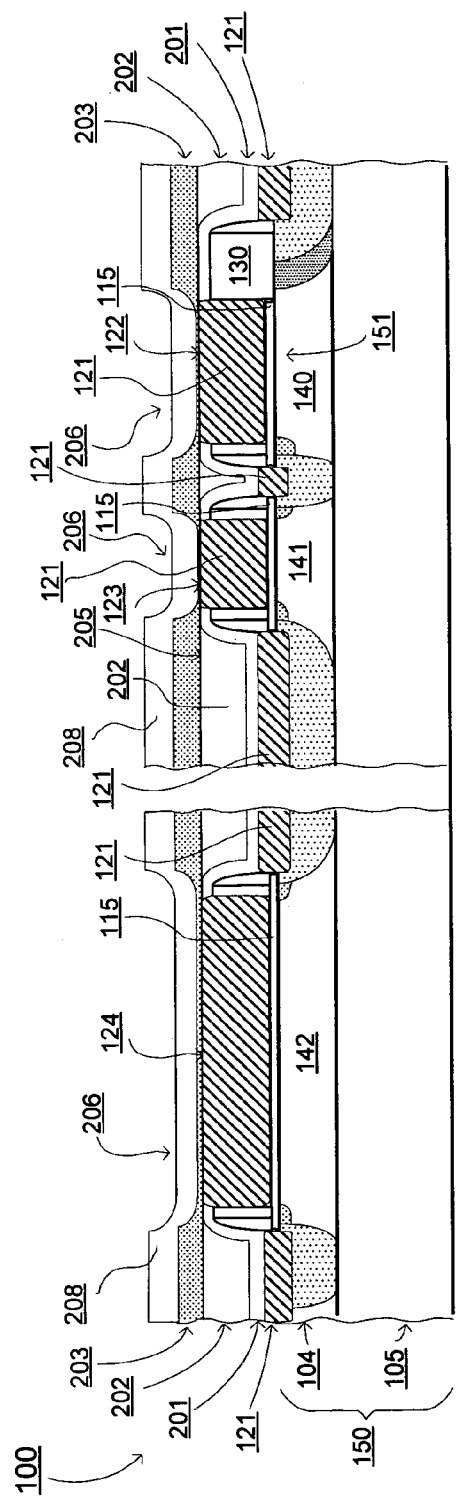
FIG. 2A
FIG. 2B

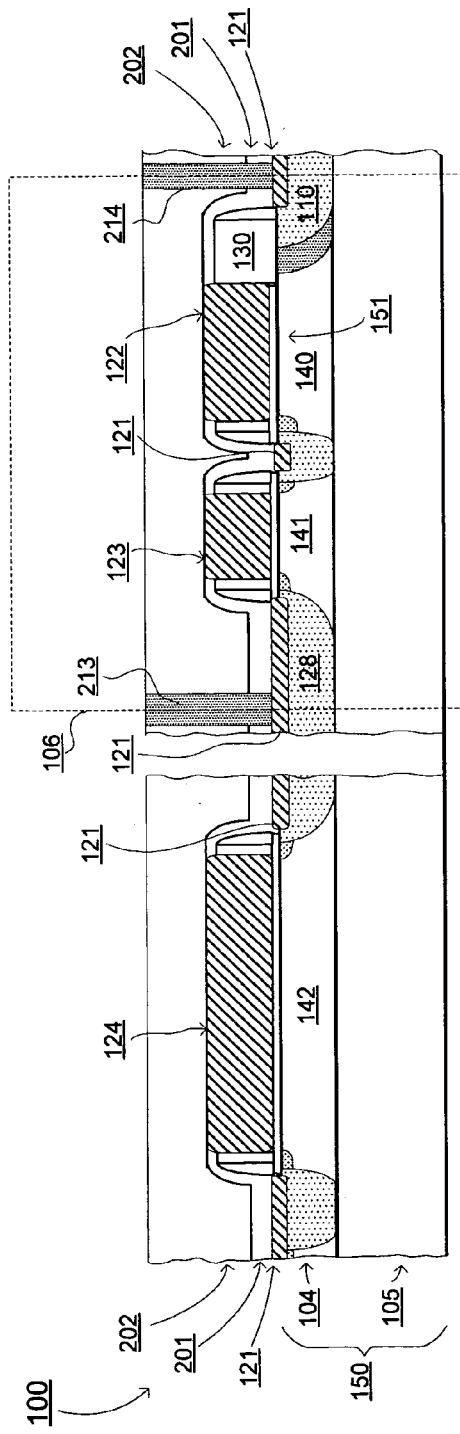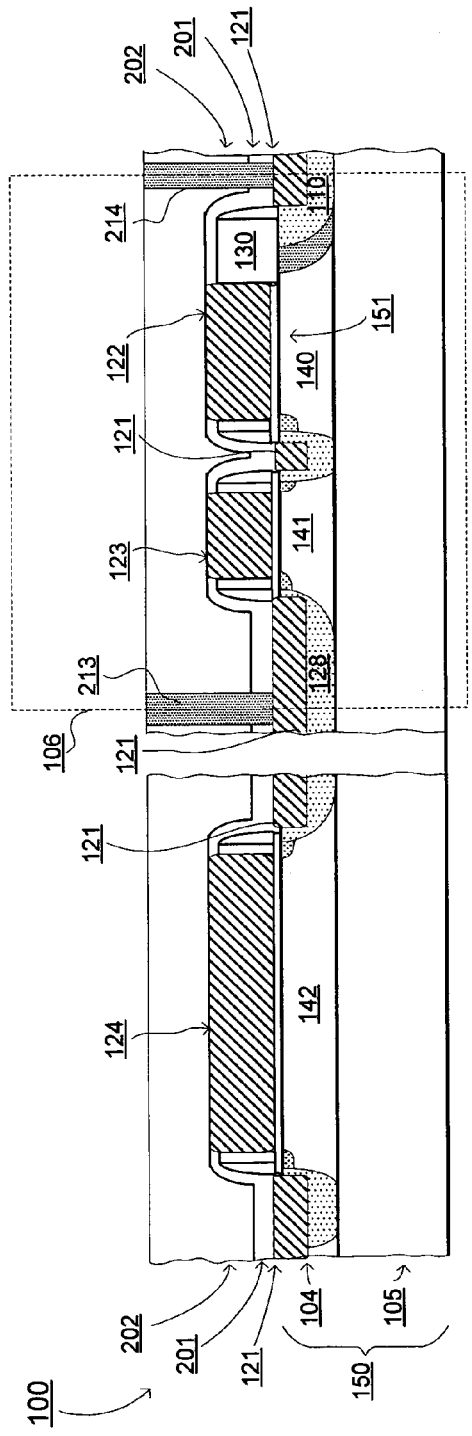

WORKFUNCTION-ADJUSTED THYRISTOR-BASED MEMORY DEVICE

FIELD OF THE INVENTION

One or more aspects of the present disclosure relate generally to semiconductor devices and, more particularly, to thyristor-based semiconductor memory.

BACKGROUND OF THE INVENTION

Conventionally, semiconductor memories such as static random access memory ("SRAM") and dynamic random access memory ("DRAM") are in widespread use. DRAM is very common due to its high density with a cell size typically between $6F^2$ and $8F^2$, where F is a minimum feature size, namely one half of the smallest pitch in an existing technology. However, DRAM is relatively slow having an access time commonly near 50 nanoseconds ("ns"). SRAM access time is typically an order of magnitude faster than DRAM. However, an SRAM cell is commonly made of four transistors and two resistors or of six transistors, thus leading to a cell size of approximately $60F^2$ to $100F^2$.

SRAM memory designs based on a negative differential resistance cell, such as a thyristor-based memory cell, have been introduced to minimize the size of a conventional SRAM memory. A thyristor-based memory may be effective in memory applications. A capacitively coupled thyristor of a thyristor-based memory operates in a range from a lower to an upper operating voltage. A workfunction of a gate, such as a control gate of the thyristor of a thyristor-based memory, may be modified by ion implantation. A material or materials, such as Germanium, Boron, or Phosphorous, or a combination thereof, may be implanted into the thyristor control gate to adjust its workfunction.

Heretofore, a thyristor-based memory had a standby voltage or a read voltage between about −3V and −1V, as mentioned in U.S. Pat. No. 6,690,039 B1. However, as is well known, a charge pump used to pump voltage down to a negative voltage consumes more power than using positive voltages, such as "off-chip" provided positive voltages, for operation of a thyristor-based memory. Thus, power consumption may be reduced if a standby voltage for a thyristor-based memory were less negative or more positive than approximately −1 V. This is because it takes more energy to pump voltage to a level outside the range of voltages provided by the "off-chip" voltage supplies (e.g., a negative voltage level) than to supply a voltage level which falls within the range of voltages provided by the "off-chip" voltage supplies.

To appreciate why power consumption may be reduced if standby voltage were increased in a positive direction, operation of a thyristor-based memory cell should be understood with respect to writing a logic zero ("write-zero operation"). For a write-zero operation, a positive voltage at a write voltage level is applied to a control gate of such thyristor-based memory device. The control gate is coupled to a wordline ("WL2") of the thyristor-based memory. After which, a standby voltage ("VStandby_WL2") is applied to WL2 to effect the storing of a logic zero in the thyristor-based memory cell. The falling edge transition to VStandby_WL2 causes minority carriers to be driven out of a base region of the thyristor-based memory device. Heretofore, this meant providing a swing from about +1V to about −2V to drive out enough minority carriers to sufficiently clear minority carriers from the base region to help maintain a reverse biased or current blocking state. Thus, the amount of voltage swing or operating voltage range on a falling edge transition for the control gate over a p-type body from a positive voltage for the write-zero operation followed by application of a negative standby voltage VStandby_WL2 is directly proportional to the amount of power consumed. More particularly, by reducing the amount of negative voltage swing within the falling edge transition, the amount of power consumed may be reduced where the capacitor coupling ratio is unchanged. In other words, charge pump efficiency may be effectively enhanced by moving VStandby_WL2 closer to the lowest external power level supplied, such as 0 volts.

Accordingly, in instances it would be desirable to modify the thyristor-based memory cell to drive out a sufficient number of minority carriers from a base for a standby state that reduces the amount of negative voltage swing between a WL2 write voltage and a WL2 standby voltage. Moreover, the closer VStandby_WL2 is to zero volts, the less power consumed in the generation of VStandby_WL2.

However, in other instances, negative voltage swing may not be reduced. In those instances, materials other than those previously used may be integrated into a control gate to achieve a useful workfunction with or without having to implant into the control gate.

SUMMARY OF THE INVENTION

One or more aspects of the present disclosure relate generally to semiconductor devices and more particularly, to thyristor-based semiconductor memory.

An aspect of the invention is a memory device, including: a thyristor-based storage element; and an access device coupled to the thyristor-based storage element at a common storage node. The thyristor-based storage element has a first gate stack, where the first gate stack has a first workfunction configured to a base region of the thyristor-based storage element. The access device has a second gate stack, where the second gate stack has a second workfunction. The first gate stack includes a first conductive layer formed over a gate dielectric and a second conductive layer formed over the first conductive layer. The second gate stack includes the second conductive layer formed over the gate dielectric. The first workfunction is operationally distinct from the second workfunction, and the first workfunction is associated with a bulk workfunction of the first conductive layer.

Another aspect of the invention is a memory device, including: a thyristor-based storage element; and an access device coupled to the thyristor-based storage element at a common storage node. The thyristor-based storage element has a first gate stack, and the first gate stack has a first workfunction configured to a p-base region associated with the thyristor-based storage element. The access device has a second gate stack, and the second gate stack has a second workfunction. The access device has an n-channel region. The first gate stack includes a conductive layer formed over a gate dielectric, and the second gate stack includes the conductive layer formed over the gate dielectric. The conductive layer of the second gate stack is implanted with ions so as to affect the second workfunction, and the conductive layer of the first gate stack is masked during the implant so as not to affect the first workfunction with the ions implanted. The first workfunction is operationally distinct from the second workfunction, and the first workfunction is associated with a bulk workfunction of the conductive layer.

Yet another aspect of the invention is a memory device, including: a thyristor-based storage element; and an access device coupled to the thyristor-based storage element at a common storage node. The thyristor-based storage element has a first gate stack, and the first gate stack has a first workfunction configured to a base region of the thyristor-based storage element. The access device has a second gate stack, and the second gate stack has a second workfunction. The first gate stack includes: a first conductive layer located over a gate dielectric, a second conductive layer located over the first conductive layer, and a third conductive layer located over the second conductive layer. The first conductive layer is formed by inter-diffusing a portion of the third conductive layer through the second conductive layer. The second conductive layer is deposited prior to the third conductive layer, and the third conductive layer is deposited prior to formation of the first conductive layer by inter-diffusion. The first workfunction is operationally distinct from the second workfunction, and the first workfunction is associated with a bulk workfunction of the first conductive layer.

Still yet another aspect of the invention is a memory device, including: a thyristor-based storage element; and an access device coupled to the thyristor-based storage element at a common storage node. The thyristor-based storage element has a first gate stack and an anode region, where the anode region is for coupling the thyristor-based storage element to a reference voltage line. The access device has a second gate stack and an source/drain region, where the source/drain region is for coupling the access device to a bitline. The first gate stack and the second gate stack each include a silicide layer, where the silicide layer is formed by generally consuming a polysilicon layer of the first gate stack and the second gate stack. The silicide layer extends to a gate dielectric layer, and the gate dielectric layer is disposed below the first gate stack and the second gate stack. The anode region, the source/drain region, and the common storage node each are at least partially disposed in a silicon substrate layer. The gate dielectric layer is disposed above the silicon substrate layer. The anode region, the source/drain region, and the common storage node are formed as respective silicide regions simultaneous with formation of at least a portion of the silicide layer.

BRIEF DESCRIPTION OF THE DRAWINGS

Accompanying drawings(s) show exemplary embodiment(s) in accordance with one or more aspects of the invention; however, the accompanying drawing(s) should not be taken to limit the invention to the embodiment(s) shown, but are for explanation and understanding only.

FIG. 2A is a cross-sectional diagram depicting an exemplary embodiment of an in-process memory device with partially silicided gates.

FIG. 2B is a cross-sectional diagram depicting an exemplary embodiment of the in-process memory device of FIG. 2A having fully silicided gates.

FIG. 2D is a cross-sectional diagram depicting an exemplary embodiment of the in-process memory device of FIG. 2B with line contacts.

FIG. 2E is a cross-sectional diagram depicting an exemplary embodiment of the memory device of FIG. 2C with line contacts.

DETAILED DESCRIPTION OF THE DRAWINGS

One or more aspects of the invention may be applicable to a variety of different types of semiconductor devices, and may be particularly suited for silicon-on-insulator ("SOI") devices, such as thyristor-based memory devices, and for enhancing the ability to form such devices. While the present disclosure is not necessarily limited to such devices, various aspects of the invention may be appreciated through a description of various examples using this context.

Figure 1:
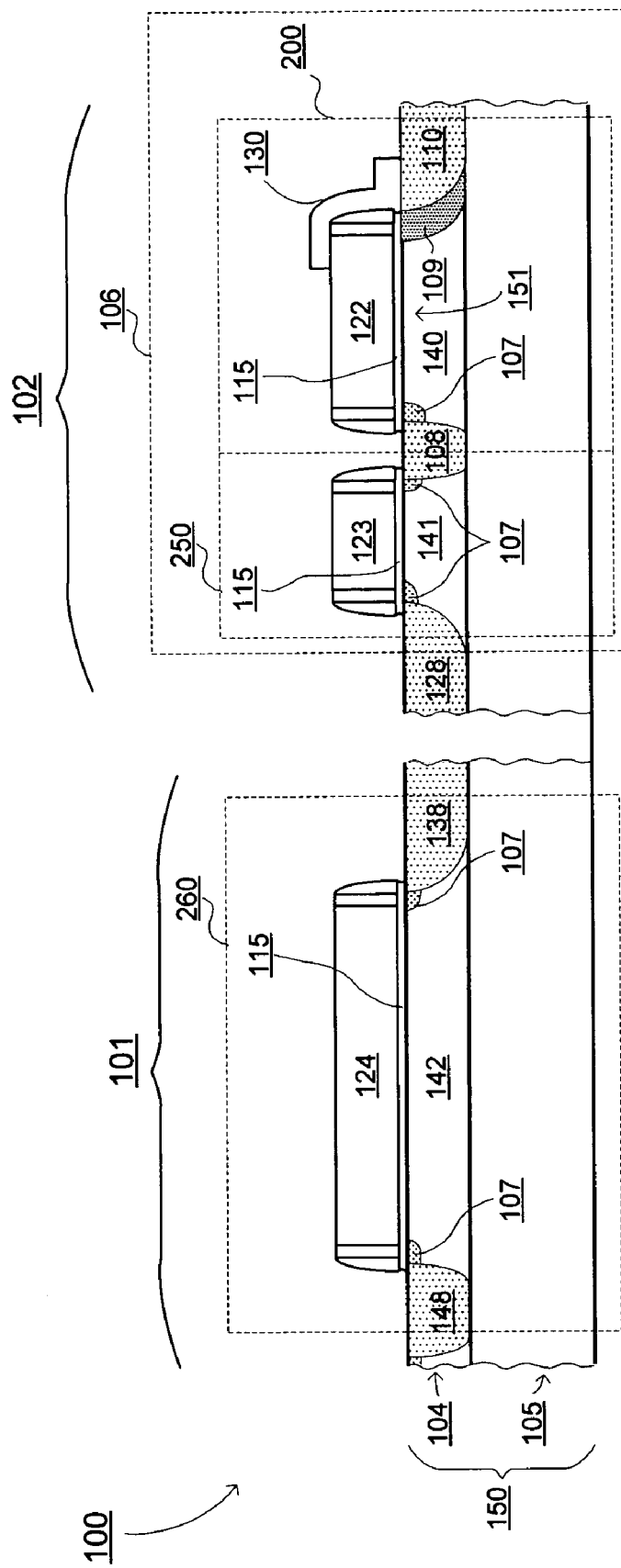
FIG. 1 is a cross-sectional view depicting an exemplary embodiment of an in-process thyristor-based memory device.

FIG. 1 is a cross-sectional view depicting an exemplary embodiment of an in-process thyristor-based memory device 100 ("memory 100"). Memory 100 may be formed using a semiconductor wafer 150, which is partially shown in FIG. 1. As illustratively shown in FIG. 1, memory 100 may have a periphery region 101 and a memory array region 102. In memory array region 102 is located at least one thyristor-based memory cell ("memory cell") 106. In periphery region 101 is at least one n-MOS transistor and at least one p-MOS transistor both of which are generally indicated as periphery transistor 260 having a transistor gate 124. Memory cell 106 may have a thyristor-based storage element ("storage element") 200 and an access device 250. Storage element 200 has a control gate 122, which may be formed from at least one layer of material. Access device 250 has an access gate 123, which may be formed from at least one layer of material. Access gate 123 and control gate 122 have different workfunctions. In this embodiment, a field-effect transistor ("FET") is shown for access device 250 and for periphery transistor 260.

For purposes of clarity by way of example and not limitation, it shall be assumed that semiconductor wafer 150 is a SOI wafer 150, unless otherwise specified. SOI wafer 150 has a buried oxide ("BOx") layer 105 and disposed thereon a semiconductive layer 104, such as a silicon layer 104. Silicon layer 104 may be doped by implanting ions of a dopant material or materials into silicon, such as for example boron ions to establish a p-type, i.e., acceptor-type, conductivity. Alternatively, other types of dopants, such as aluminum and indium, may be used for p-type implantation. As another alternative, silicon layer 104 may be doped to establish an n-type, i.e., donor-type conductivity, by adding donor dopants such as phosphorous or arsenic ions, for example.

In an exemplary embodiment illustratively shown in FIG. 1, silicon layer 104 has formed therein a p-type anode region 110, an n-type base ("n-base") region 109, a p-type base ("p-base") region 140 including a channel region 151, an n-type cathode region 108, an access transistor body region 141, and access transistor source/drain region 128.

Periphery transistor 260 includes a body region 142, a transistor gate 124, and source/drain regions 138 and 148. Additionally, extension regions 107 may be included as part of periphery transistor 260 and memory cell 106, as is known. Again, periphery transistor 260 may be an n-MOS device or a p-MOS device.

At least one gate dielectric 115 is formed over silicon layer 104, which may include formation by oxidation of a portion of silicon layer 104. Notably, dielectric 115 may include one or more dielectric layers. Disposed on gate dielectric 115 are gates 122, 123, and 124. Although gates 122, 123 and 124 are generally indicated in FIG. 1, it shall be appreciated from the description that follows that one or more of such gates may be formed to provide a workfunction that facilitates reducing the magnitude of negative voltage VStandby_WL2. With respect to reducing the magnitude of negative voltage VStandby_WL2, it should be appreciated that a voltage may be applied to control gate 122 of storage element 200 to capacitively couple via dielectric 115 to p-base region 140 of silicon layer 104 to drive out minority carriers of channel region 151 to put storage element 200 in a blocking state. Alternatively or in addition to reducing the magnitude of negative voltage VStandby_WL2, one or more of such gates 122, 123 and 124 may be formed with materials other than those previously used to achieve a workfunction with or without implantation into at least one gate of gates 122, 123 and 124.

Notably, though a spacer 130 is illustratively shown in FIG. 1 as overhanging a portion of control gate 122, for clarity spacer 130 is shown in the following FIGS. without such overhang. Moreover, although gate dielectric 115 is generally shown as having the same thickness for access device 250 and storage element 200, it should be appreciated that gate dielectric 115 may be formed thicker for storage element 200 than for access device 250.

FIG. 2A is a cross-sectional diagram depicting an exemplary embodiment of an in-process memory 100 with partially silicided gates 122, 123, and 124. To form a silicide, which may be a self-aligned silicide ("salicide"), a metal or metals may be deposited to form a silicide when annealed with silicon, as described below in more detail. As used herein, the term "compound" is meant to include silicides, which are sometimes referred to as alloys.

In this embodiment, silicide regions 121 are formed in a conventional manner. Silicide regions 121 exist as ohmic contacts to silicon layer 104 and to gates 122, 123, and 124. After which dielectric layers 201 and 202 may be deposited. Dielectric layer 201 may be a nitride liner layer, and dielectric layer 202 may be a padding layer of a silicon oxide. Memory 100 may then be processed, such as with chemical-mechanical polishing ("CMP"), to expose upper surfaces of silicide regions 121 of gates 122, 123, and 124. Accordingly, a stop on silicide of polysilicon gates CMP may be used.

A metal layer 203 is then deposited over an upper surface 205 of memory 100. Metal layer 203 may be formed using a deposition of a metal or metals, or compositions of metals, known to form a silicide when annealed with silicon. An example of such a compound forming metal is Co, which may be used in this exemplary embodiment, though other known metals for silicidation may be used. Examples of other known metal or compositions of metals which may be used for silicidation include nickel (Ni), palladium (Pd), tungsten (W), and Ni in a composition with Co. For example, metal layer 203 may be deposited by co-sputtering from both a Ni and a Co target. A workfunction of a silicide formed may be tuned by changing a ratio for the composition of metals forming the silicide, which are Co and Ni in this example.

In this embodiment, a metal layer 203 of Co may be deposited with a thickness sufficient to provide silicidation of remaining un-silicided polysilicon 211, such as polysilicon, of control gates 122, 123, and 124 of memory 100. Polysilicon 211 is left after silicidation forming silicides 121.

In another embodiment as illustratively shown in FIG. 2A, an optional capping metal layer 208 is formed. This deposition may be done after an HF clean of surface 205. Capping metal layer 208 may be Ti for example for forming part of a silicide with metal layer 203. For purposes of clarity, it shall be assumed that capping metal layer 208 is used in this embodiment.

Silicidation may be provided by using a furnace-type anneal or a rapid thermal anneal ("RTA"). RTA may be used in one step or in several steps for full silicidation of the remaining polysilicon 211. The time and temperature of such RTA depends on the thickness of polysilicon 211, which may vary from application to application as is known. Dielectric 115 may serve as a silicidation stop for full silicidation of gates 122, 123, and 124. In an embodiment, gate dielectric 115 may be silicon dioxide as little to no reaction generally occurs between Co and silicon oxide, and thus the silicidation of remaining un-silicided polysilicon 211 may limit itself once the silicidation front arrives at silicon oxide layer 115.

Accordingly, it should be appreciated that a target workfunction may be obtained without an enhancing ion implantation of a dopant, such as phosphorous (P), arsenic (As), and antimony (Sb) for example, into polysilicon of either all or a portion of control gates 122, 123, and 124 prior to silicidation thereof. Workfunction values for fully silicided gates 122, 123, and 124 may be approximately between 4.35 to 4.85 eV. Workfunction values of silicided control gates 122, 123, and 124 may be further tuned by changing chemical compositions of substitutional metal impurities therein. For example, using a chemical composition of Co and Ni, which forms a $Co_{(1-x)}Ni_xSi_2$ silicide when annealed with silicon, an overall workfunction may be engineered by changing an x component in the chemical composition forming $Co_{(1-x)}Ni_xSi_2$ silicide. The overall workfunction of a control gate may be varied by approximately +/−0.05 eV, as a result of the x component adjustment in the chemical composition, where x is a component value between 0 and 1.

FIG. 2B is a cross-sectional diagram depicting an exemplary embodiment of an in-process memory 100 having fully silicided gates 122, 123, and 124. Craters 206 are formed as the result of depletion in the formation of fully silicided gates 122, 123, and 124. Following gate silicidation, a metal etch process, such as a wet etch, may be used to remove residues of metal layers 203 and 208 from surface 205. Reaction time may be kept sufficiently short such that little or none of Ti capping layer 208 reacts with an underlying layer.

Figure 2C:
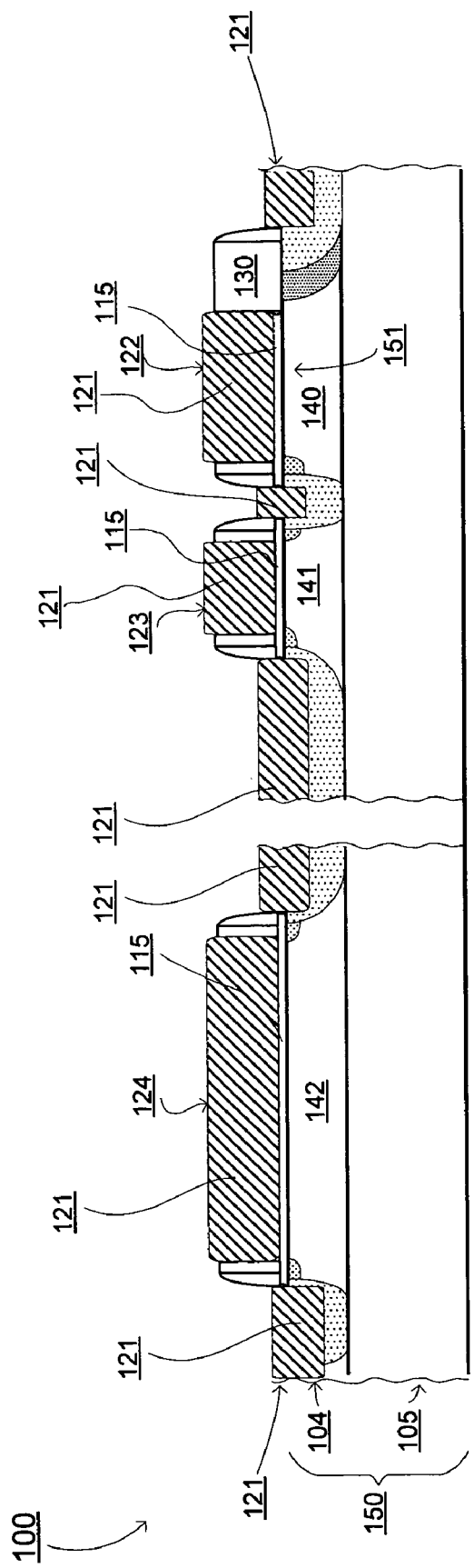
FIG. 2C is a cross-sectional diagram depicting an exemplary embodiment of an in-process memory device having fully silicided gates and commensurately thick silicided ohmic contacts of in a silicon layer.

FIG. 2C is a cross-sectional diagram depicting an exemplary embodiment of an in-process memory 100 having fully silicided gates 122, 123, and 124 and commensurately thick silicided ohmic contacts 121 of silicon layer 104. Memory 100 of FIG. 2C has silicide regions 121 of silicon layer 104, as well as gates 122, 123, and 124, formed as described above, except that silicide regions 121 of silicon layer 104 are formed prior to forming dielectric layers 201 and 202. Thus, metal layer 203, as well as metal layer 208, of FIG. 2B may be deposited, generally conformally, on memory 100 for forming silicide regions 121 of silicon layer 104 and of gates 122, 123, and 124 during the same silicidation anneal.

Such anneal is done until polysilicon of gates 122, 123, and 124 is fully silicided. Accordingly, in contrast to FIG. 2B, memory 100 of FIG. 2C has thicker silicide regions 121 of silicon layer 104 for providing ohmic contacts. Other details regarding the formation of memory 100 of FIG. 2C follow from the above description of FIG. 2A, such as deposition of dielectric layers 201 and 202. Notably, in those embodiments where silicide regions 121 are silicided along with gates 122, 123, and 124, dielectric layer 202, which may at least in part define distance between a metal-1 layer and silicon layer 104, may be formed thicker than in those embodiments where two separate silicidations are respectively used to form fully silicided gates 122, 123, and 124 and ohmic contact regions in silicon layer 141.

FIGS. 2D and 2E are respective cross-sectional diagrams respectively depicting an exemplary embodiment of memory 100 having fully silicided control gates 122, 123, and 124 having substantially "thin" silicided regions 121 in silicon layer 104, and an exemplary embodiment of memory 100 having fully silicided control gates 122, 123, and 124 having substantially "thick" silicided regions 121 in silicon layer 104. Memory cell 106 has line contacts 213 and 214. Line contact 213 is a bitline contact to region 128 via an associated silicide region 121 of memory cell 106. Line contact 214 is a reference voltage line contact to region 110 via an associated silicide region 121 of memory cell 106. Additionally, regarding memory cell 106, control gate 122 may be part of a wordline ("WL2") in relation to an active area, such as p-base region 140, of a plurality of memory cells where such wordline would extend lengthwise into and out of the page, and access gate 123 may be part of another wordline ("WL1") in relation to another active area, such as access transistor body region 141, of a plurality of memory cells where such wordline would extend lengthwise into and out of the page.

Notably, for purposes of clarity not shown in the remaining figures is a transistor gate 124, as it may be formed in like manner to either access gate 123 or control gate 122 of FIG. 1 as described with reference to FIGS. 3, 4, and 5A-C.

Figure 3:
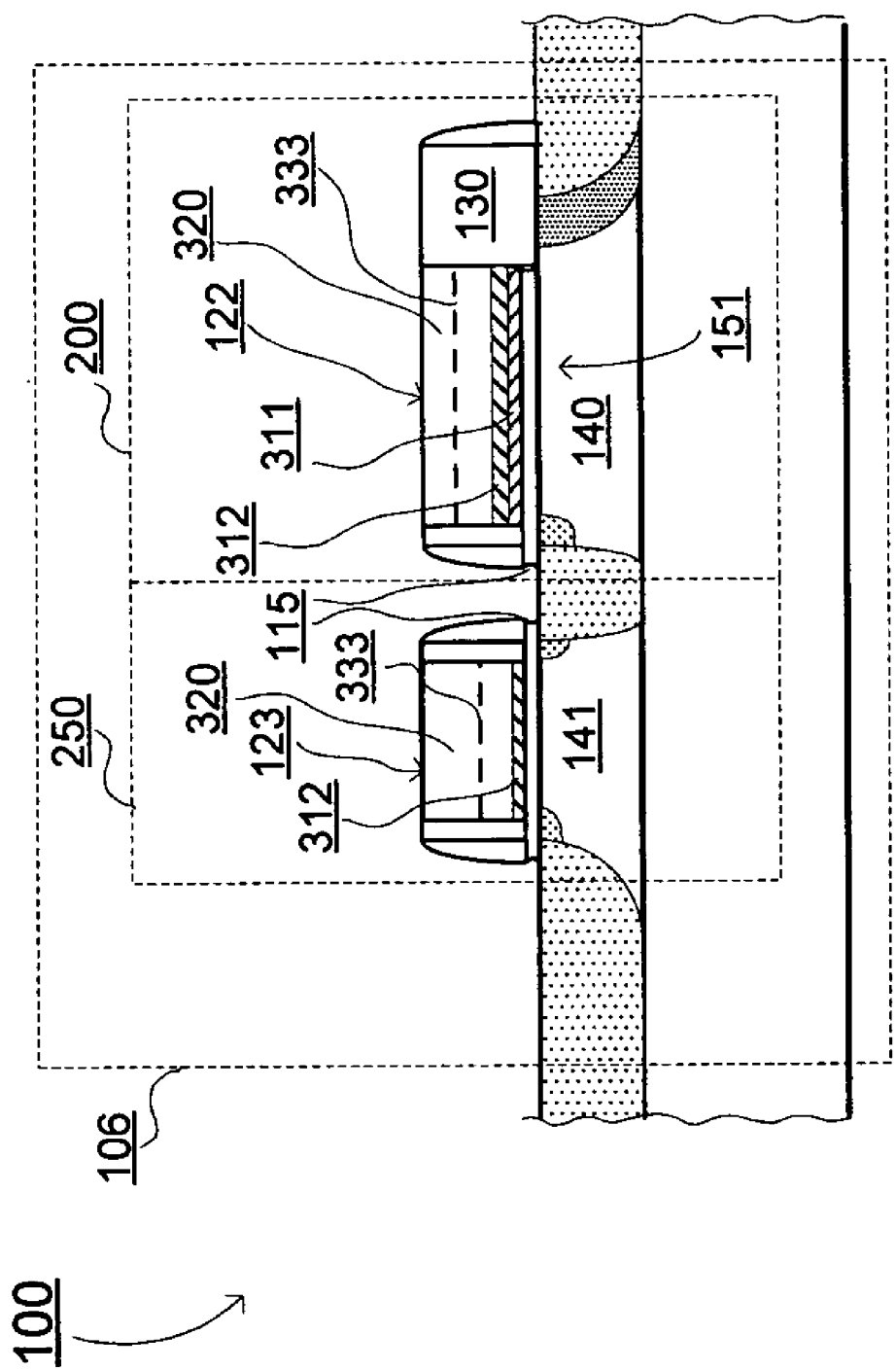
FIG. 3 is a cross-sectional view depicting an alternative exemplary embodiment of a dual metal layer gate version of a memory cell.

FIG. 3 is a cross-sectional view depicting an alternative exemplary embodiment of a dual metal layer gate version of memory 100. Memory 100 may be formed where gate stacks 122 and 123 have different workfunctions. More particularly, gate 122 may be tailored to be adjusted to complement doping of channel region 151. Gate stack 122 may be formed with conductive metal layers 311 and 312 having a polysilicon silicided layer 320 formed over them. Metal layer 311 may be formed to provide a gate workfunction as targeted toward inhibiting an n-type channel region 151 in p-base 140 during operation of a thyristor-based memory. Accordingly, threshold voltage for turning on an n-type channel region 151 in p-base 140 for putting storage element 200 in a conductive state may be higher than threshold voltage of an access device 250.

One example pair of metals may be a metal layer 311 of titanium nitride (TiN) and a metal layer 312 of tantalum silicon nitride, namely $Ta_xSi_yN$ ("TaSiN"). Other examples may include a metal layer 311 of TiN and a metal layer 312 of tungsten (W), and a metal layer 311 of TaSiN and a metal layer 312 of rhenium (Re). An example of TiN layer 311 and TaSiN layer 312 is further described though other metal layers may be used.

In an embodiment, metal layer 311 is formed over dielectric layer 115. In an embodiment, gate dielectric layer 115 may be formed having a hafnium dioxide ($HfO_2$) layer deposited over silicon layer 104. For such an embodiment, gate dielectric layer 115 may be formed by using either metal-organic chemical vapor deposition (MOCVD) or atomic layer chemical vapor deposition (ALCVD). Thickness of $HfO_2$ gate dielectric layer 115 may approximately 2.2 nm thick.

For metal layer 311 being TiN, metal layer 311 may be deposited over gate dielectric layer 115 by physical vapor deposition (PVD) or chemical vapor deposition (CVD). TiN metal layer 311 may have a workfunction of up to approximately 4.9 eV. Metal layer 311 may be blanket deposited, and a mask, such as an oxide hardmask or a resist mask, may be patterned to protect p-base regions, such as a p-base region 140, for etching of exposed TiN of metal layer 311. A clean, such as an HF clean, may be used prior to deposition of metal layer 312. TaSiN metal layer 312 may be deposited using PVD or CVD. TaSiN metal layer 312 may be approximately 10 to 40 nm thick.

Following the formation of TaSiN metal layer 312, polysilicon capping layer 320 may be deposited over TaSiN metal layer 312. Polysilicon capping layer 320 may be an n-type in-situ doped polysilicon layer or formed using CVD followed by an n-type ion implantation. Thus, for example, n-channel MOSFETs may have their gates formed with metal layer 312 disposed over associated channel regions, and p-channel MOSFET and thyristor-based storage elements may have their gates formed with metal layer 311 disposed over associated channel regions. Gate 122 may be formed concurrently with a p-MOS transistor gate 124 of FIG. 1. Polysilicon capping layer 320 may be approximately 100 nm thick. Polysilicon capping layer 320 may subsequently be silicided with metal layers 311 and 312. The remainder of memory cell 106 may be formed in a known manner, as generally indicated in FIG. 3 with spacers, including spacer 130.

An alternative metal for metal layers 311 and 312 may respectively be molybdenum (Mo) and Ti. In such an embodiment dielectric layer 115 may be a silicon nitride. In this embodiment, a TiN layer may be deposited over metal layer 312 prior to formation of polysilicon layer 320, as generally indicated by dashed line 333. Notably, a Mo gate may be implanted for tuning workfunction, as described in additional detail with reference to FIG. 4.

Figure 4:
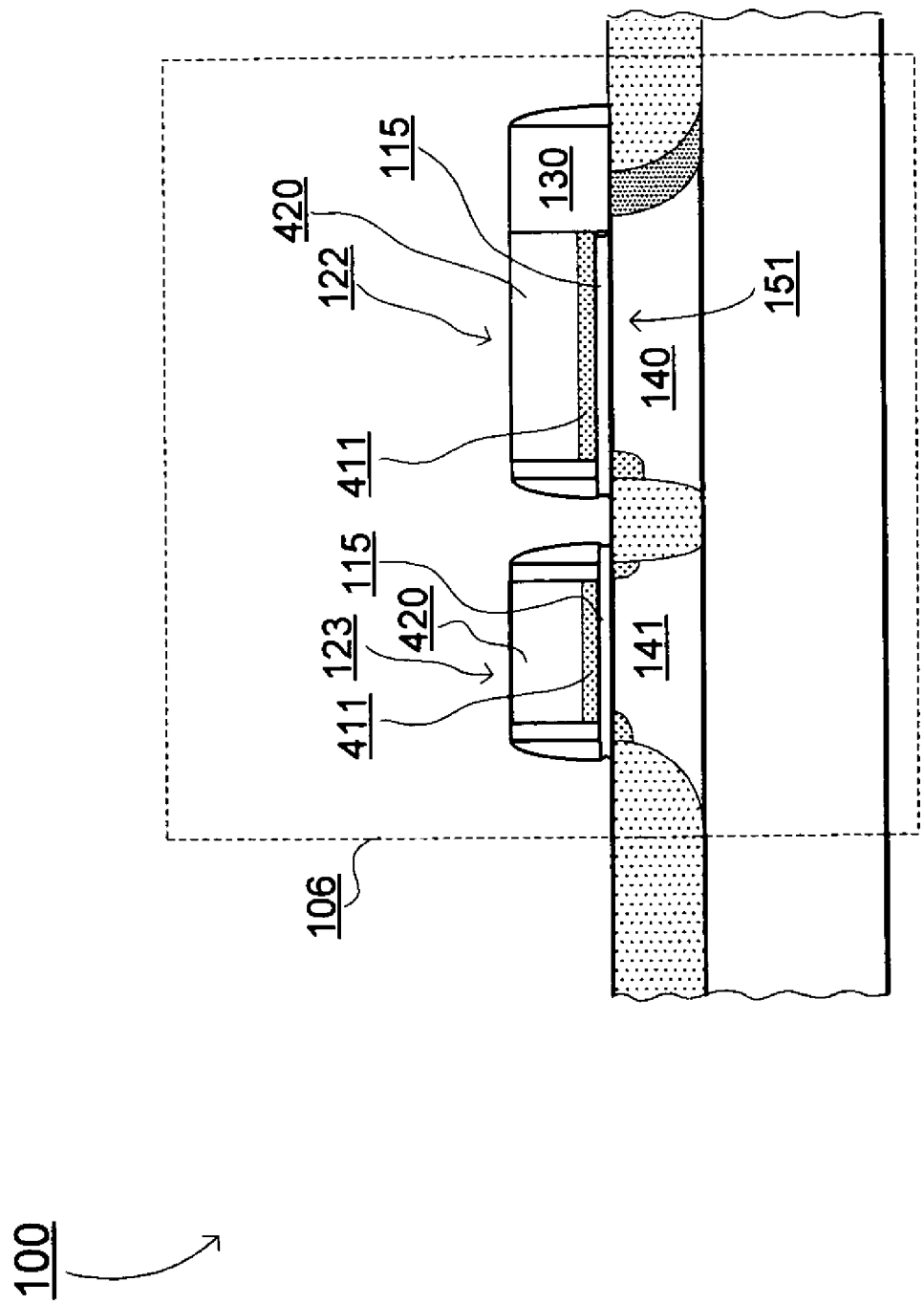
FIG. 4 is a cross-sectional view depicting an exemplary embodiment of a memory cell having an implanted-metal gate and an un-implanted gate.

FIG. 4 is a cross-sectional view depicting an exemplary embodiment of memory 100 having an implanted-metal gate and an un-implanted gate of memory cell 106. A metal layer 411 is formed over dielectric layer 115. Metal layer 411 may be formed as a molybdenum (Mo) metal layer 411 sputter deposited over a silicon oxide dielectric layer 115. Mo metal layer 611 may be deposited to a thickness of approximately 65 nm. For an n-type channel region 151 of p-base 140, control gate 122 is masked to cover an associated portion of metal layer 411. Additionally, p-MOS gates, such as a p-MOS gate 124 of FIG. 1, in periphery circuitry may be formed like control gate 122, namely they may be formed with metal layer 411 and then masked. Notably, formation of n-type channel region 151 may be inhibited by raising the threshold voltage for its formation by having a p-type doped control gate 122.

An implant is done into exposed portions of metal layer 411, including exposed portions associated with access gate 123. This implant may be a nitrogen implant with a dosage of approximately $5\times10^{15}$ cm$^{-2}$ of nitrogen ions. The workfunction value of implanted Mo layer 411 may be adjusted by changing the energy of the nitrogen implant. Without wishing to be bound by theory, this effect may be due to modulation of the amount of nitrogen incorporated near the interface between the metal gate and the dielectric layer. For example, energy of nitrogen implant may be set to locate the median of the distribution of nitrogen ions at about one half to one third of the thickness from the top of Mo metal layer 411. Additionally, n-MOS gates in periphery circuitry, such as an n-MOS gate 124 of FIG. 1, may be formed like access gate 123, such as for example being implanted with nitrogen. Accordingly, n-MOS gates in the periphery may have a same or similar workfunction to access gate 123, and p-MOS gates in the periphery may have a same or similar workfunction to control gate 122. After such implant, masking may be removed.

Thus, memory cell 106 may be formed where gates 122 and 123 have different workfunctions. Notably, no p-type implant need be done into metal layer 411 of control gate 122, nor of p-MOS devices in the periphery formed in the same manner as control gate 122.

Following the deposition and implantation for this embodiment, a polysilicon layer 420 may be deposited over metal layer 411. For example, polysilicon layer 420 may be an n-type doped polysilicon layer of approximately 100 nm thickness may be deposited. Polysilicon layer 420 in an implementation may be annealed at approximately 800 degrees Celsius or higher to activate n-type dopant therein. The remainder of memory cell 106 may be formed in a known manner, as generally indicated in FIG. 4 with spacers, including spacer 130.

Figure 5A:
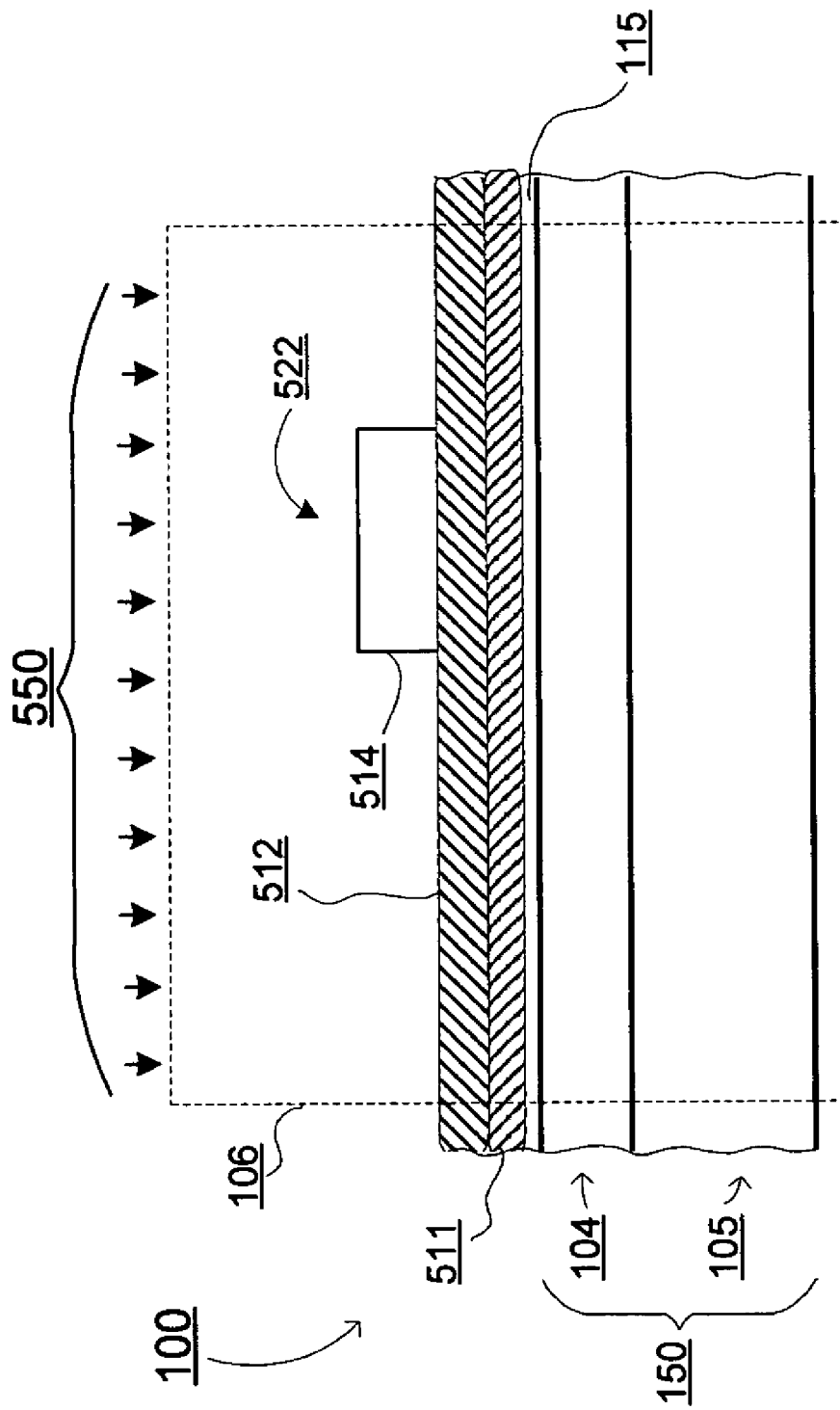
FIGS. 5A, 5B, and 5C are cross-sectional views depicting an exemplary embodiment of a memory cell at various in-process stages for forming an inter-diffusion gate stack.
Figure 5B:
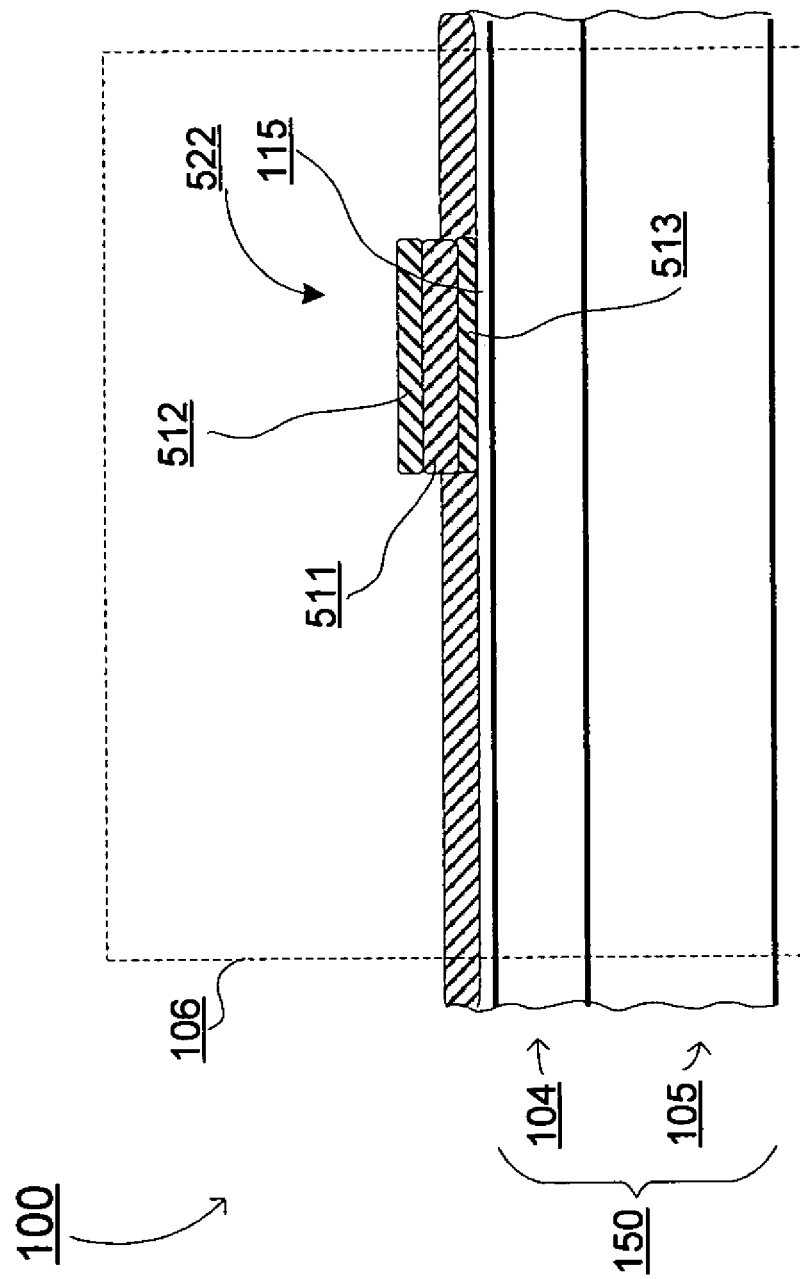
Figure 5C:
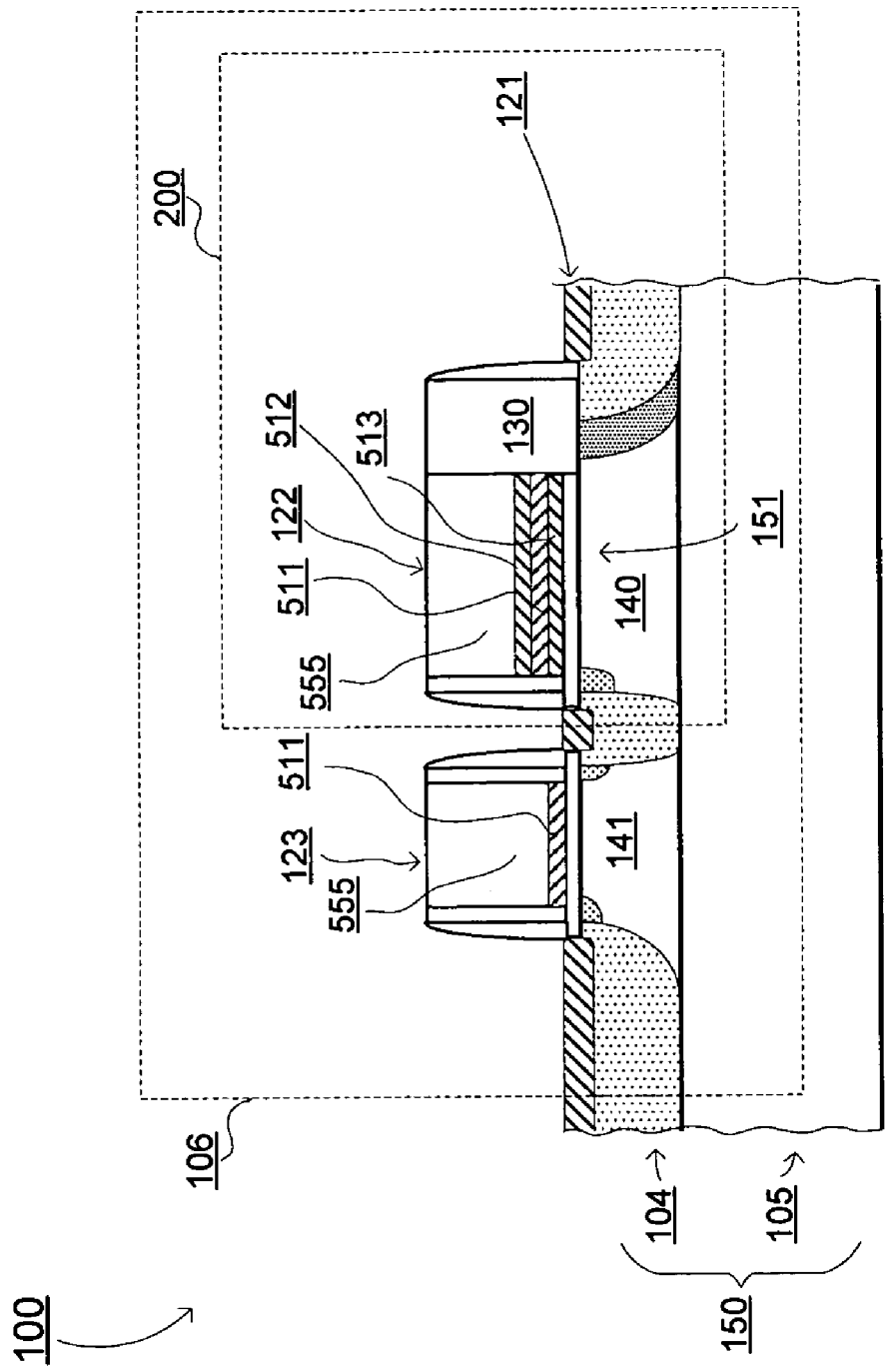

FIGS. 5A, 5B, and 5C are cross-sectional views depicting an exemplary embodiment of memory 100 at various in-process stages for forming an inter-diffusion gate stack.

In FIG. 5A, a first metal layer 511 of gate stack 522 may be a low-workfunction metal, for example Ti with a work function of approximately 4 eV. Metal layer 511 may be sputter deposited over dielectric layer 115. This deposition is a blanket deposition over wafer 150. For example, a thickness of Ti low-workfunction metal layer 511 deposited may be approximately 10 nm. Notably, Ti reacts with silicon dioxide at elevated temperatures, and thus depending on process thermal budget, a silicon oxide may or may not be used for dielectric layer 115. If thermal budget is a limiting factor, a high-k dielectric, such as tantalum or zirconium oxide, for example such as $Ta_2O_3$ or $ZrO_2$ respectively, may be used for dielectric layer 115. A second metal layer 512 of gate stack 522 may be blanket deposited over metal layer 512. Metal of metal layer 512 is a high-workfunction metal, such as Ni for example with a work function of approximately 5.3 eV. Metal layer 512 may be sputter deposited over Ti low-workfunction metal layer 511 to an approximate thickness of about 20 nm. A mask 514 may be patterned to protect metal layer 512 from etch 550, which may be a wet etch. Notably, p-MOS regions in periphery region 101 of FIG. 1 may be protected by mask 514, while leaving n-MOS regions in periphery region 101 of FIG. 1 exposed.

Metal of metal layer 512 is selected such that in elemental form it diffuses through metal of metal layer 511. Following etch 550 of metal layer 512 and removal of mask 514, gate stack 522 includes metal layer 511 and a remaining portion of metal layer 512. An anneal of memory 100 is then done to facilitate inter-diffusion of metal of metal layer 512 through metal layer 511, as illustratively shown in FIG. 5B. In an embodiment, this anneal may be done in a gas, such as forming gas ($N_2+H_2$), and may done at approximately 400 degrees Celsius for approximately 30 minutes. The anneal is provided to assist diffusivity of high-workfunction layer 512 through low-workfunction metal layer 511 with a diffusion stop on dielectric layer 115. During the annealing, a metal layer 513 is formed. Metal layer 513 in this embodiment is elemental Ni.

Gate stack 522 and p-MOS gate regions, such as for control gate 123 of FIG. 5C, may be masked, and a dry etch may be used to remove exposed portions of metal layer 511. Referring to FIG. 5C, metal layer 511 may be used as part of a gate stack for access gate 123, and metal layers 513, 511, and 512 may be used as part of a gate stack for control gate 122. Additionally, polysilicon layer 555 may be formed over metal layer 511 of access gate 123 and over metal layer 512 of control gate 122. The remainder of memory cell 106 may be formed in a known manner, as generally indicated in FIG. 5C with spacers, including spacer 130.

While not wishing to be bound by theory, it is believed that a particular gate workfunction may be principally affected by the workfunction of the gate dielectric material. Additionally, it should be appreciated that, in a thyristor-based memory cell, respective gates for a thyristor control port, such as a thyristor control gate, and for an access device, such as an access transistor, may be configured to provide different workfunctions, where the workfunction value of the former is greater than the workfunction value of the latter. For example, workfunction of a thyristor control gate may be approximately at least 0.1 eV greater, and more particularly from approximately 0.8 to 1.0 eV greater, than workfunction of control gate of an access transistor.

In the above described embodiments, a gate stack within a thyristor-based storage element has been formed to provide a different workfunction than an associated access device. Accordingly, it should be understood that in each of these embodiments known process technologies may be used to form such gates. Taking these known process technologies, thyristor-based storage elements may be formed with associated workfunctions to move VStandby_WL2 closer to zero volts, and thus less power may be consumed in the generation of VStandby_WL2.

Alternatively or in addition to moving VStandby_WL2 closer to zero volts, materials other than those previously used may be integrated into a control gate of a thyristor-based storage element to achieve a useful workfunction without having to implant into the control gate. Furthermore, a control gate of a thyristor-based storage element may be formed like a p-MOS transistor in periphery circuitry.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A memory device, comprising:
   a thyristor-based storage element; and
   an access device coupled to the thyristor-based storage element at a common storage node;
   the thyristor-based storage element having a first gate stack, the first gate stack having a first workfunction configured to a base region of the thyristor-based storage element;
   the access device having a second gate stack, the second gate stack having a second workfunction;
   the first gate stack includes a first conductive layer formed over a gate dielectric and a second conductive layer formed over the first conductive layer;
   the second gate stack includes the second conductive layer formed over the gate dielectric;

wherein the first workfunction is operationally distinct from the second workfunction, the first workfunction associated with a bulk workfunction of the first conductive layer.

2. The memory device according to claim 1, wherein the first conductive layer is formed of a titanium nitride, wherein the second conductive layer is formed of tantalum silicon nitride, and wherein the gate dielectric includes hafnium dioxide.

3. The memory device according to claim 2, wherein each of the first gate stack and the second gate stack include a polysilicon layer.

4. The memory device according to claim 2, wherein the base region is a p-base region, the memory device further comprising a p-MOS transistor in a periphery region, the thyristor-based storage element disposed in a memory array region separate from the periphery region, the p-MOS transistor having a first transistor gate, the first transistor gate formed in conjunction with the first gate stack to at least approximate the first workfunction.

5. The memory device according to claim 1, wherein the first conductive layer is formed of molybdenum, wherein the second conductive layer is formed of titanium, and wherein the gate dielectric includes a silicon nitride.

6. The memory device according to claim 5, wherein each of the first gate stack and the second gate stack include a polysilicon layer.

7. The memory device according to claim 6, wherein each of the first gate stack and the second gate stack include a titanium nitride layer between the second conductive layer and the polysilicon layer.

8. The memory device according to claim 5, further comprising a p-MOS transistor in a periphery region, the thyristor-based storage element disposed in a memory array region separate from the periphery region, the p-MOS transistor having a first transistor gate, the first transistor gate formed in conjunction with the first gate stack to at least approximate the first workfunction.

9. A memory device, comprising:
a thyristor-based storage element; and
an access device coupled to the thyristor-based storage element at a common storage node;
the thyristor-based storage element having a first gate stack, the first gate stack having a first workfunction configured to a p-base region associated with the thyristor-based storage element;
the access device having a second gate stack, the second gate stack having a second workfunction, the access device having an n-channel region;
the first gate stack includes a conductive layer formed over a gate dielectric;
the second gate stack includes the conductive layer formed over the gate dielectric, the conductive layer of the second gate stack being implanted with ions so as to affect the second workfunction, the conductive layer of the first gate stack being masked during the implant so as not to affect the first workfunction with the ions implanted;
wherein the first workfunction is operationally distinct from the second workfunction, the first workfunction associated with a bulk workfunction of the conductive layer.

10. The memory device according to claim 9, wherein the conductive layer is formed of molybdenum, and wherein the reactive ions are nitrogen ions.

11. The memory device according to claim 10, further comprising a p-MOS transistor in a periphery region, the thyristor-based storage element disposed in a memory array region separate from the periphery region, the p-MOS transistor having a first transistor gate, the first transistor gate formed in conjunction with the first gate stack to at least approximate the first workfunction.

12. The memory device according to claim 11, further comprising an n-MOS transistor in the periphery region, the n-MOS transistor having a second transistor gate, the second transistor gate formed in conjunction with the second gate stack to at least approximate the second workfunction.

13. The memory device according to claim 12, further comprising forming a polysilicon layer over the conductive layer for the first gate stack and the second gate stack.

14. A memory device, comprising:
a thyristor-based storage element; and
an access device coupled to the thyristor-based storage element at a common storage node;
the thyristor-based storage element having a first gate stack, the first gate stack having a first workfunction configured to a base region of the thyristor-based storage element;
the access device having a second gate stack, the second gate stack having a second workfunction;
the first gate stack includes: a first conductive layer located over a gate dielectric, a second conductive layer located over the first conductive layer, and a third conductive layer located over the second conductive layer;
the first conductive layer being formed by inter-diffusing a portion of the third conductive layer through the second conductive layer, the second conductive layer being deposited prior to the third conductive layer, the third conductive layer being deposited prior to formation of the first conductive layer by inter-diffusion;
wherein the first workfunction is operationally distinct from the second workfunction, the first workfunction associated with a bulk workfunction of the first conductive layer.

15. The memory device according to claim 14, wherein:
the second gate stack includes the second conductive layer located over the gate dielectric;
the second conductive layer being formed from a first deposited metal layer;
the first conductive layer and the third conductive layer formed from a second deposited metal layer formed over the first deposited metal layer and partially inter-diffused therethrough;
the first deposited metal layer having the second workfunction;
the second deposited metal layer having the first workfunction, the first workfunction being greater than the second workfunction.

16. The memory device according to claim 15, wherein the first deposited metal layer is formed of titanium, and wherein the second deposited metal layer is formed of nickel, and wherein the gate dielectric is selected from a tantalum oxide, a silicon oxide, and a zirconium oxide.

17. The memory device according to claim 16, wherein the first gate stack includes a polysilicon layer disposed above the third conductive layer, and wherein the second gate stack includes the polysilicon layer disposed above the second conductive layer.

18. The memory device according to claim 14, wherein the base region is a p-base region, the memory device further comprising:
a p-MOS transistor in a periphery region, the thyristor-based storage element disposed in a memory array region separate from the periphery region, the p-MOS transistor having a first transistor gate, the first transistor gate formed in conjunction with the first gate stack to at least approximate the first workfunction.

19. The memory device according to claim 18, further comprising an n-MOS transistor in the periphery region, the n-MOS transistor having a second transistor gate, the second transistor gate formed in conjunction with the second gate stack to at least approximate the second workfunction.

20. A memory device, comprising:
a thyristor-based storage element;
an access device coupled to the thyristor-based storage element at a common storage node;
the thyristor-based storage element having a first gate stack and an anode region, the anode region for coupling the thyristor-based storage element to a reference voltage line;
the access device having a second gate stack and an source/drain region, the source/drain region for coupling the access device to a bitline;
the first gate stack and the second gate stack each include a silicide layer, the silicide layer formed by generally consuming a polysilicon layer of the first gate stack and the second gate stack, wherein the silicide layer extends to a gate dielectric layer, the gate dielectric layer disposed below the first gate stack and the second gate stack;
the anode region, the source/drain region, and the common storage node each being at least partially disposed in a silicon substrate layer, the gate dielectric layer disposed above the silicon substrate layer, the anode region, the source/drain region, and the common storage node formed as respective silicide regions simultaneous with formation of at least a portion of the silicide layer;
the silicide layer being partially formed simultaneously with formation of the silicide regions and completely formed after the formation of the silicide regions;
the silicide regions being substantially thinner than the silicide layer;
after formation of the silicide regions, the silicide layer being completely formed by:
silicidation with a first metal layer disposed above the first gate stack and the second gate stack; and
silicidation with a second metal layer disposed above the first metal layer.

21. The memory device according to claim 20, wherein the first metal layer is a metal selected from nickel, palladium, tungsten, and nickel in a composition with cobalt.

22. The memory device according to claim 21, wherein the second metal layer is a titanium.

23. A memory device, comprising:
a thyristor-based storage element;
an access device coupled to the thyristor-based storage element at a common storage node;
the thyristor-based storage element having a first gate stack and an anode region, the anode region for coupling the thyristor-based storage element to a reference voltage line;
the access device having a second gate stack and an source/drain region, the source/drain region for coupling the access device to a bitline;
the first gate stack and the second gate stack each include a silicide layer, the silicide layer formed by generally consuming a polysilicon layer of the first gate stack and the second gate stack, wherein the silicide layer extends to a gate dielectric layer, the gate dielectric layer disposed below the first gate stack and the second gate stack;
the anode region, the source/drain region, and the common storage node each being at least partially disposed in a silicon substrate layer, the gate dielectric layer disposed above the silicon substrate layer, the anode region, the source/drain region, and the common storage node formed as respective silicide regions simultaneous with formation of at least a portion of the silicide layer;
the silicide layer being completely formed simultaneously with formation of the silicide regions;
the silicide regions being substantially a same thickness as the silicide layer;
the silicide layer being completely formed by:
silicidation with a first metal layer disposed above the first gate stack and the second gate stack; and
silicidation with a second metal layer disposed above the first metal layer.

24. The memory device according to claim 23, wherein the first metal layer is a metal selected from nickel, palladium, tungsten, and nickel in a composition with cobalt.

25. The memory device according to claim 24, wherein the second metal layer is a titanium.

* * * * *